(12) United States Patent
Heo

(10) Patent No.: US 10,217,964 B2
(45) Date of Patent: Feb. 26, 2019

(54) OPTICAL MEMBER AND DISPLAY APPARATUS HAVING SAME

(71) Applicant: CHANGKANG CHEMICAL CO., LTD, Ansan-si, Gyeonggi-do (KR)

(72) Inventor: Young Tae Heo, Ansan-si (KR)

(73) Assignee: Changkang Chemical Co., Ltd., Ansan-Si (KR)

( * ) Notice: Subject to any disclaimer, the term of this patent is extended or adjusted under 35 U.S.C. 154(b) by 55 days.

(21) Appl. No.: 15/102,151

(22) PCT Filed: Dec. 2, 2014

(86) PCT No.: PCT/KR2014/011693
§ 371 (c)(1),
(2) Date: Jul. 13, 2016

(87) PCT Pub. No.: WO2015/084018
PCT Pub. Date: Jun. 11, 2015

(65) Prior Publication Data
US 2016/0315287 A1    Oct. 27, 2016

(30) Foreign Application Priority Data
Dec. 6, 2013 (KR) .......................... 10-2013-0151690

(51) Int. Cl.
*H01L 51/52* (2006.01)
*G02B 5/02* (2006.01)
(Continued)

(52) U.S. Cl.
CPC ........ *H01L 51/5268* (2013.01); *G02B 5/0242* (2013.01); *G02B 5/0278* (2013.01);
(Continued)

(58) Field of Classification Search
None
See application file for complete search history.

(56) References Cited

U.S. PATENT DOCUMENTS

| 2003/0095332 | A1  | 5/2003 | Gardner et al. |
| 2005/0194896 | A1* | 9/2005 | Sugita ................ B82Y 20/00 313/506 |

(Continued)

FOREIGN PATENT DOCUMENTS

| JP | 2010044269 A | * | 2/2010 |
| JP | 2010044269 A |   | 2/2010 |

(Continued)

OTHER PUBLICATIONS

International Search Report (with English translation) regarding PCT/KR2014/011693, dated Feb. 11, 2015.
(Continued)

*Primary Examiner* — Michael Lebentritt
*Assistant Examiner* — Jordan M Klein
(74) *Attorney, Agent, or Firm* — Harness, Dickey & Pierce, P.L.C.

(57) ABSTRACT

An optical member and a display including the same are provided. The optical member includes a first layer that includes a convex part, which includes a plurality of protrusions, and a cover having a refractive index lower than that of the convex part and a second layer that is located on at least one side of the first layer and includes a plurality of scattering particles dispersed in the interior thereof.

14 Claims, 4 Drawing Sheets

(51) Int. Cl.
*G02B 5/30* (2006.01)
*G06F 3/041* (2006.01)
*G02B 3/00* (2006.01)
*G02B 5/04* (2006.01)
*H01L 27/32* (2006.01)

(52) U.S. Cl.
CPC ......... *G02B 5/0294* (2013.01); *G02B 5/3033* (2013.01); *G02B 5/3041* (2013.01); *G02B 5/3083* (2013.01); *G06F 3/041* (2013.01); *H01L 51/5275* (2013.01); *H01L 51/5293* (2013.01); *G02B 3/0056* (2013.01); *G02B 5/045* (2013.01); *H01L 27/323* (2013.01); *H01L 51/5281* (2013.01)

(56) References Cited

U.S. PATENT DOCUMENTS

| | | | | |
|---|---|---|---|---|
| 2006/0152147 | A1* | 7/2006 | Lee | B82Y 30/00 |
| | | | | 313/504 |
| 2007/0058258 | A1* | 3/2007 | Mather | G02B 27/2214 |
| | | | | 359/619 |
| 2010/0328575 | A1* | 12/2010 | Shinkai | G02B 5/0215 |
| | | | | 349/62 |
| 2012/0241771 | A1* | 9/2012 | Kato | H01L 51/5275 |
| | | | | 257/88 |
| 2012/0286258 | A1* | 11/2012 | Naraoka | C09K 11/06 |
| | | | | 257/40 |
| 2016/0020416 | A1* | 1/2016 | Guimard | H01L 51/5212 |
| | | | | 257/40 |
| 2016/0041312 | A1* | 2/2016 | Morinaka | H01L 51/5268 |
| | | | | 257/98 |

FOREIGN PATENT DOCUMENTS

| | | | |
|---|---|---|---|
| KR | 1020060081190 A | | 7/2006 |
| KR | 20100051446 A | * | 5/2010 |
| KR | 1020100051446 A | | 5/2010 |
| KR | 1020120054887 A | | 5/2012 |
| WO | 2005024473 A2 | | 3/2005 |

OTHER PUBLICATIONS

Written Opinion regarding PCT/KR2014/011693, dated Feb. 11, 2015.

* cited by examiner

[Fig.1]
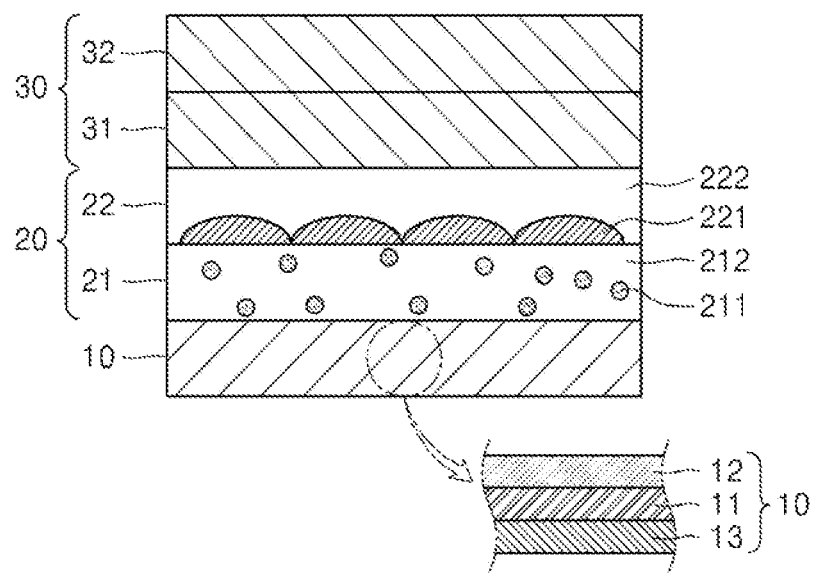
[Fig.2]
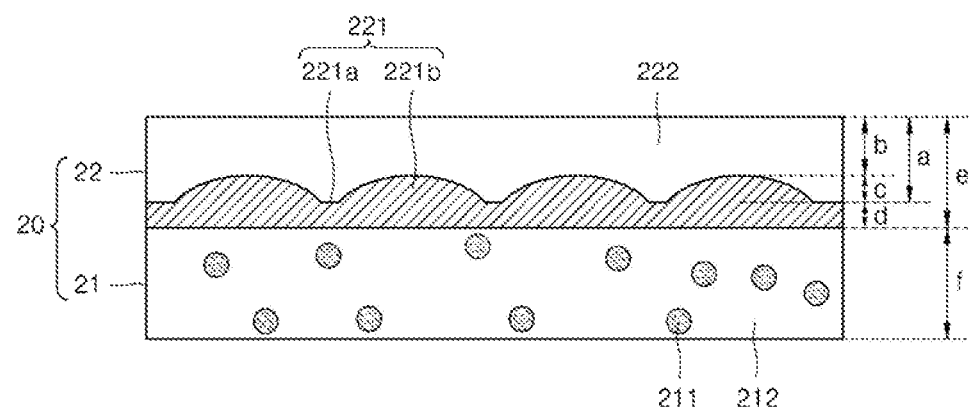

[Fig.3]
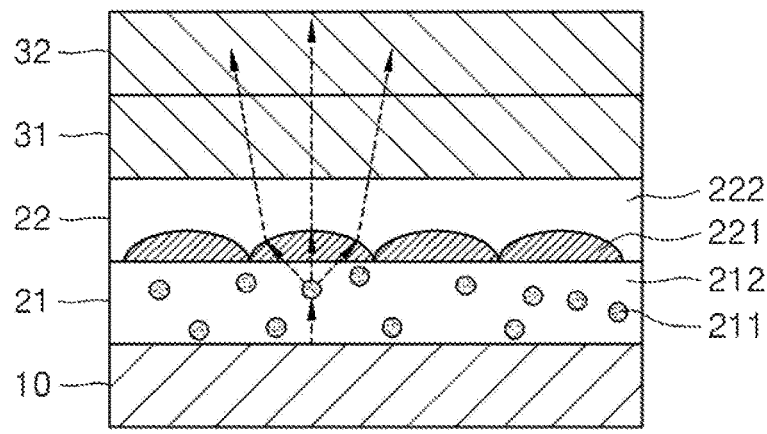
[Fig.4]
(a) 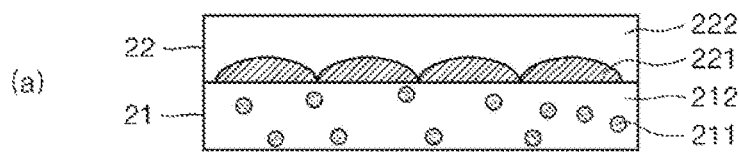
(b) 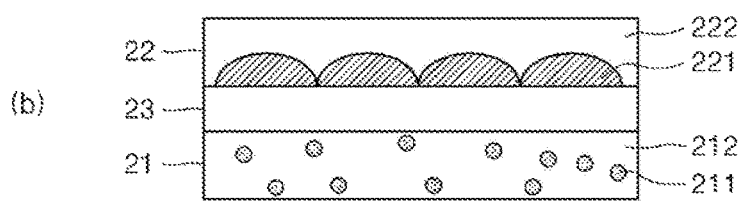
(c) 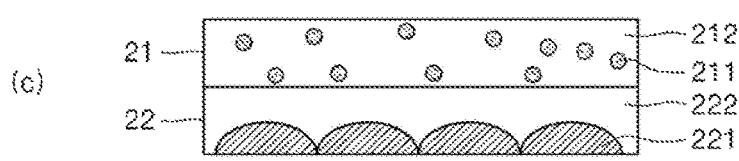
(d) 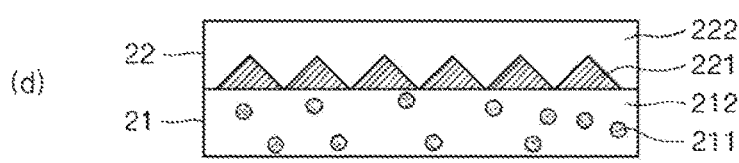

[Fig.5]
(a) 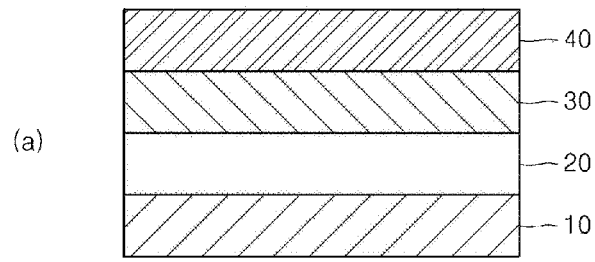
(b) 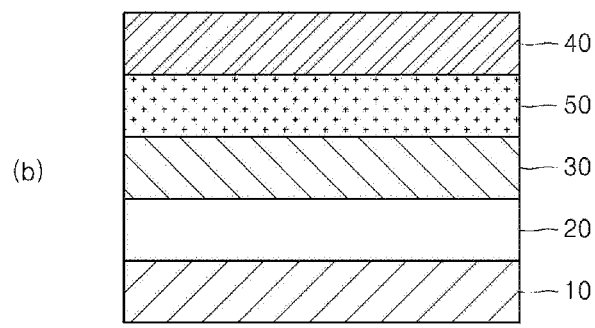
(c) 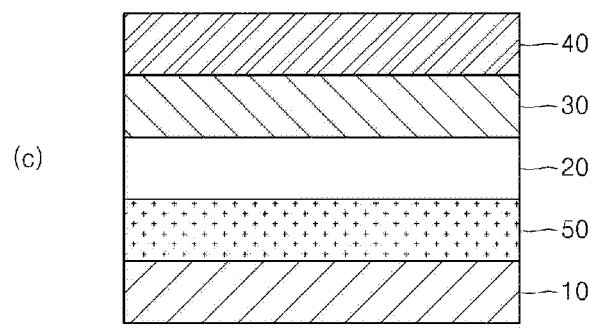

[Fig.6]
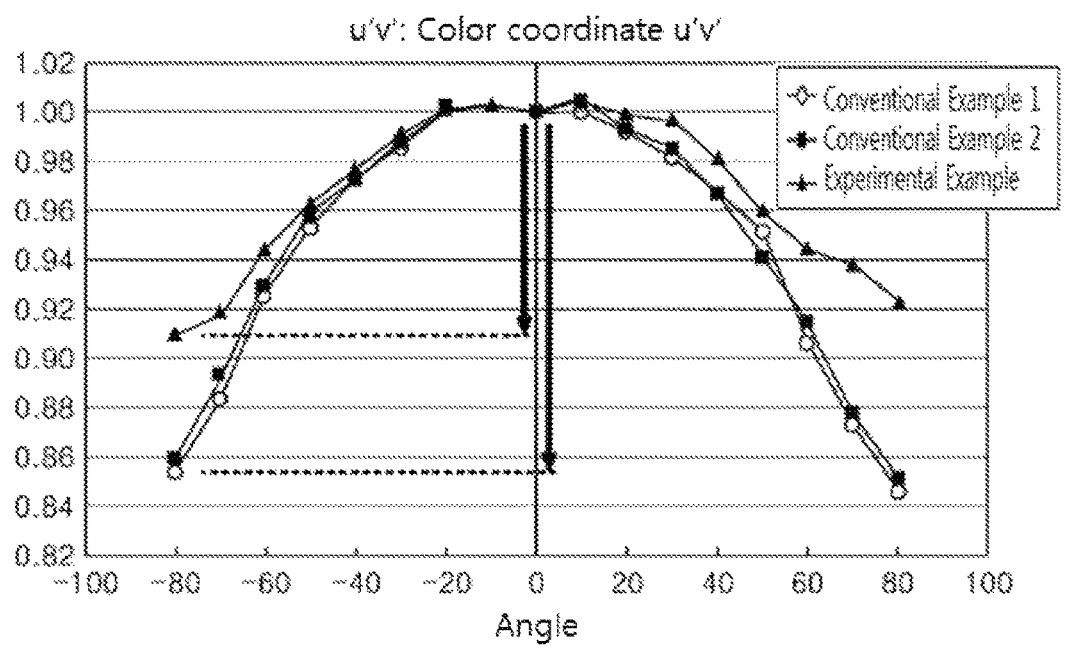
[Fig.7]
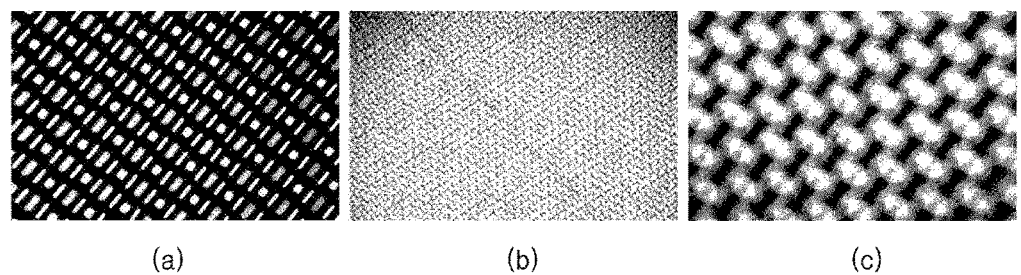
(a)　　　　　　　　　(b)　　　　　　　　　(c)

OPTICAL MEMBER AND DISPLAY APPARATUS HAVING SAME

CROSS-REFERENCE TO RELATED APPLICATIONS

This application is the United States national phase of International Application No. PCT/KR2014/011693 filed Dec. 2, 2014, and claims priority to Korean Patent Application No. 10-2013-0151690 filed Dec. 6, 2013, the disclosures of which are hereby incorporated by reference.

BACKGROUND

Field of the Invention

The present invention relates to an optical member and a display including the same, and more particularly, to an optical member for increasing optical extraction efficiency and improving color shift and a display including the same.

Background Art

Recently, flat panel displays have attracted attention as display devices. Examples of such flat panel displays include liquid crystal displays, plasma display panels, organic light-emitting displays, and the like.

Thereamong, an organic light-emitting display has a wide viewing angle and fast response speed, thus realizing a high-definition display. Such an organic light-emitting display includes a substrate, a transparent first electrode formed on the substrate, an organic layer formed on the first electrode, and a second electrode with a high reflectivity formed on the organic layer. A glass or plastic substrate is generally used as the substrate. Examples of the organic layer include a hole injection layer, a hole transport layer, a light emitting layer, a hole blocking layer, and an electron transport layer. That is, a plurality of organic layers is laminated between the first and second electrodes, and thus, a multilayer organic light-emitting display is manufactured.

Meanwhile, in an organic light-emitting display, light proceeds sideways, not forward, due to internal reflection, and thus, optical extraction efficiency is decreased. To address such a problem, a microlens array has been formed on a first electrode to prevent light from proceeding sideways.

However, it is difficult to manufacture a large-area microlens array. In addition, light is focused forward while passing through a microlens and thus light is overlapped, thereby generating image blur wherein output images are unclear. Such image blur deteriorates display quality.

Meanwhile, Korean Patent Application Pub. No. 10-2006-0081190 discloses technology for an electroluminescent device including a substrate, first and second electrodes, and an organic layer, which is disposed between the first and second electrodes and includes at least one light emitting layer, and a plurality of metal nanopatterns formed on at least one side of the first and second electrodes.

PRIOR DOCUMENT (Patent Document 1) Korean Patent Application Pub. No. 10-2006-0081190

SUMMARY OF THE INVENTION

Technical Problem

The present invention is directed to providing an optical member to improve optical extraction efficiency and a display including the same.

The present invention is directed to providing an optical member to inhibit image blur and improve color shift and a display including the same.

Technical Solution

An optical member according to an embodiment of the present invention includes a first layer including a convex part, which includes a plurality of protrusions, and a cover, which has a refractive index lower than that of the convex part; and a second layer located on at least one side of the first layer and including a plurality of scattering particles dispersed in the interior thereof.

Here, the second layer may include a base material, the scattering particles may be dispersed in the base material, and at least one of the cover and the base material may include an adhesive.

In addition, a third layer including a polymer resin may be disposed between the first and second layers and a refractive index difference between the convex part and the cover may be 0.01 to 0.4.

The protrusions may have at least one of a unidirectionally extended rod shape and separated island shape and the protrusions may contact each other or spaced apart from each other. In addition, cross section shapes of the protrusions may include at least one of a polygon, a semicircle, and an oval.

With regard to a structure, the thickness of the first layer may be greater than or equal to a thickness of the second layer, the height of the convex part is 60 to 100 when the thickness of the first layer is 100, and the height from tops of the protrusions to an upper side of the first layer may be 0 to 50 μm.

With regard to the refractive index of each member, when a refractive index of the base material is n1, a refractive index of the convex part is n2, a refractive index of the cover is n3, and a refractive index of the scattering particles is n4, n2 may be greater than n1 and n3 and a value of n1 may differ from a value of n4, and a difference between n1 and n4 may be 0.01 to 0.7.

A display according to an embodiment of the present invention includes a light emitting layer in which light is generated; a circular polarization layer formed on the light emitting layer; and a pattern layer including a first layer, which is disposed between the light emitting layer and the circular polarization layer and includes a convex part including a plurality of protrusions, and a second layer, which is disposed at least one side of the first layer and includes a plurality of scattering particles dispersed therein.

Here, the circular polarization layer includes a retardation film (QWP) and a polarizing film formed on the retardation film (QWP), and a touch panel may be disposed on an upper part of the circular polarization layer or between the light emitting layer and the pattern layer.

In addition, the first layer may contact the retardation film and the second layer may contact the light emitting layer, and a third layer including a polymer resin may be disposed between the first and second layers.

A cover may be disposed on an upper part of the convex part of the first layer and a refractive index difference between the cover, the convex part may be lower than a refractive index difference between the convex part and air, the second layer may include a base material, and the scattering particles may be dispersed in the base material.

With regard to a refractive index, when a refractive index of the base material is n1, a refractive index of the convex part is n2, a refractive index of the cover is n3, and a refractive index of the scattering particles is n4, n2 may be greater than n1 and n3 and a value of n1 may differ from that of n4.

Meanwhile, at least one of the cover and the base material may include an adhesive and the scattering particles may be included in a content of 0.01 to 3% by weight with respect to a total weight of the second layer.

In addition, when the thickness of the first layer is 100, the height of the convex part may be 60 to 100, the height from the tops of the protrusions to an upper side of the first layer may be 0 to 50 µm, the height of the cover may be 0.1 to 100 µm, and the heights of the protrusions may be 0.1 to 50 µm.

Effect of the Invention

According to examples of the present invention, a first layer that includes a convex part, which includes a plurality of protrusions, and a cover with a low refractive index and a second layer that includes a plurality of scattering particles dispersed therein are used together as optical members. That is, such optical members are formed on a light emitting layer.

According to examples of the present invention, optical extraction efficiency is increased by inhibiting total reflection while inhibiting a decrease in the brightness of a front surface of the display. In addition, the present invention can reduce overlap between pixels without decreasing in the optical extraction efficiency, thereby inhibiting an image blur phenomenon.

In addition, according to examples of the present invention, color shift wherein color rapidly changes depending upon viewing angles can be improved.

Further, according to examples of the present invention, optical members can be easily manufactured as separate members independent of the display and disposed at various sites of the display depending upon desired performance, thereby improving the optical performance of display.

BRIEF DESCRIPTION OF DRAWINGS

FIG. 1 schematically illustrates a display according to an example of the present invention.

FIG. 2 illustrates an optical member according to an example of the present invention.

FIG. 3 conceptually illustrates a light emission path in a display according to an example of the present invention.

FIG. 4 illustrates optical members according to various modified examples of the present invention.

FIG. 5 schematically illustrates displays according to various modified examples of the present invention.

FIG. 6 illustrates a color coordinate graph dependent upon viewing angles according to an experimental example of the present invention.

FIG. 7 illustrates pixel images according to an experimental example of the present invention.

DETAILED DESCRIPTION OF THE INVENTION

Examples of the present invention will now be described more fully with reference to the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. For descriptive convenience, thicknesses of some layers and regions are exaggerated in the drawings. Like reference numerals refer to like elements throughout.

FIG. 1 schematically illustrates a display according to an example of the present invention, and FIG. 2 illustrates an optical member according to an example of the present invention.

Referring to FIG. 1, a display according to an example of the present invention receives electrical signals and thus optically displays an image. The display includes a light emitting layer 10, in which light is generated, a circular polarization layer 30 formed on the light emitting layer 10, and a pattern layer 20. The pattern layer 20 is disposed between the light emitting layer 10 and the circular polarization layer 30 and includes a first layer 22, which includes a convex part including a plurality of protrusions, and a second layer 21, which is disposed on at least one side of the first layer 22 and including a plurality of scattering particles dispersed therein.

The light emitting layer 10 is composed of an organic substance and includes an organic light emitting layer which is self-luminous. The light emitting layer 10 includes an organic layer 11 generating light, a first electrode 12 formed on one side of the organic layer 11, and a second electrode 13 formed on the other side of the organic layer 11. The first electrode 12 functions as an anode, is formed of a transparent conductive oxide through which light passes, and may be any one of indium tin oxide (ITO), indium zinc oxide (IZO), zinc oxide (ZnO), and $In_2O_3$. The second electrode 13 functions as a cathode, is formed of a metal material which reflects light, and may be any one of LiF/Al, Ca/Al, Ca/Ag, Ag, Au, and Cu. The first electrode 12, as a transparent electrode through which light passes, is disposed between the organic layer 11 and the pattern layer 20. The second electrode 13, which reflects light, is formed on the other side of the organic layer 11.

The organic layer 11 includes a hole injection layer (HIL), a hole transport layer (HTL), a light emitting layer, a hole blocking layer (HBL), and an electron transport layer (ETL), etc. Here, the hole injection layer (HIL), the hole transport layer (HTL), the light emitting layer (EML), the hole blocking layer (HBL), and the electron transport layer (ETL) may be sequentially laminated from the first electrode 12 to the second electrode 13. Of course, depending upon the structure and characteristics of the light emitting layer 10 to be manufactured, at least one of the hole injection layer (HIL), the hole transport layer (HTL), the hole blocking layer (HBL), and the electron transport layer (ETL) might not be formed. Alternatively, another layer may be additionally formed thereon.

A bottom emission type, i.e., light generated in the organic layer 11 is emitted toward an anode (the first electrode 12) by forming the first electrode 12 for an anode with a transparent material and forming a transparent material for a cathode with a highly reflective material, was described above. However, the present invention is not limited thereto and includes a top emission type wherein light generated in the organic layer 11 is emitted toward a cathode (the second electrode 13). When the light emitting layer 10 adopts the top emission type, the first electrode 12 for the anode is formed of a highly reflective material, e.g., a metal such as Ni, and the second electrode 13 for a cathode is formed of a thin metal material such that light can pass through the second electrode 13. In such a top emission type, the pattern layer 20 and the circular polarization layer 30 are laminated in a lower direction of the second electrode 13 (a lower direction of the second electrode 13 of FIG. 1). In another example, a transparent emission type wherein light generated in the organic layer 11 is emitted in both anode (the first electrode 12) and cathode (the second electrode 13) directions can be adopted. In the transparent emission type, both the first and second electrodes 12 and 13 of the light emitting layer 10 are transparent, and the pattern layer 20 and a polarizing film 32 are laminated on each of an upper part of the first electrode 12 and a lower part of the second electrode 13.

The circular polarization layer 30 prevents external light from re-reflecting in a display panel and blocks reflection of external light, thereby improving brightness and color purity. In addition, the circular polarization layer 30 may include a retardation film (QWP) and a polarizing film (Pol).

The polarizing film 32 is formed on a retardation film 31 and allows absorption of polarized light with a specific direction, e.g., polarized light on a Y axis, of light incident from the outside (hereinafter referred to as external incident light), and transmittance of polarized light with the other direction, e.g., polarized light on an X axis.

The retardation film (QWP) 31 is disposed between the pattern layer 20 and the polarizing film 32. The retardation film (QWP) 31 delays the phase of linearly polarized light passing through the polarizing film 32, thus converting the linearly polarized light into circularly polarized light. The retardation film 31 used is similar or equal to that in general displays, and thus, a detailed description thereof is omitted.

Here, external incident light, which is not absorbed by and passes through the polarizing film 32, is diffused by the pattern layer 20 and is then incident on the light emitting layer 10. The polarizing film 32 may be formed of a material in which polyvinyl alcohol (PVA) and an iodine-based dye are mixed. For example, the polarizing film 32 may be formed by manufacturing the material including polyvinyl alcohol (PVA) and an iodine-based dye into a film shape and then attaching the film onto the retardation film 31. Here, the polarizing film 32 is not limited to a polarizing film formed of the aforementioned material and may be various polarizing films used in general displays.

The pattern layer 20 is a type of an optical member disposed between the light emitting layer 10 and the circular polarization layer 30 and is used to improve optical performance of a display.

Referring to FIGS. 1 and 2, the optical member according to an example of the present invention includes the first layer 22, which includes a convex part 221 including a plurality of protrusions 221b and a cover 222 having a refractive index lower than that of the convex part 221, and the second layer 21, which is disposed on at least one side of the first layer 22 and includes a plurality of scattering particles 211 dispersed in the interior thereof.

The first layer 22 concentrates light emitted from the light emitting layer 10, thus improving the brightness of a front surface. The first layer 22 includes the convex part 221 and the cover 222 covering an upper part of the convex part 221. Here, the first layer 22 may contact the retardation film 31. The convex part 221 includes a residual part 221a connecting the upwardly protruded protrusions 221b and covering an upper side of the second layer 21.

The protrusions 221b may be formed into a unidirectionally extended rod shape, a separated island shape, or a combination thereof. That is, the protrusions 221b may have a rod shape that extends from one side of the first layer 22 to an opposing side. The protrusions 221b may have, for example, a rod shape having a curved cross section, a prism pattern, or a lenticular pattern. In addition, each of the protrusions 221b may be arranged in an isolated island pattern and may have a structure in which, for example, pyramids, triangular pyramids, and circular cones are disposed. Such protrusions 221b may contact each other or may be spaced apart from each other. In addition, vertically cut cross sections of the protrusions 221b may have at least one shape of a polygon, a semicircle, and an oval. For example, cross section shapes of the protrusions 221b may include at least one of a triangle, a trapezoid, a quadrangle, a semicircle, a circular arc, and an oval. In addition, formed protrusions 221b may have the same size, or different sizes, e.g., random sizes. The protrusions 221b may be regularly or randomly and irregularly disposed. The protrusions 221b may occupy an area of 20 to 100% with respect to a total area of the first layer 22. As illustrated in the figures, when the protrusions 221b are formed into a convex lens shape, an aspect ratio of the cross section of the lens may be 0.01:1 to 2:1. In addition, when the protrusions 221b have a prism pattern having triangle cross sections, the angle of the apex of the prism may be 40° to 170°, and an aspect ratio of the cross section of the prism may be 0.08:1 to 2:1.

The residual part 221a is a pattern residual layer formed upon manufacturing of the protrusions 221b and may be formed to various thicknesses depending upon manufacturing methods. The residual part 221a is formed on an upper side of the second layer 21 and increases the binding force between the convex part 221 and the second layer 21. In addition, the convex part 221 including the protrusions 221b and the residual part 221a may be made of a photocurable composition or a thermosetting composition and may have a refractive index of, for example, 1.51 to 1.7.

The cover 222, which is formed on an upper part of the convex part 221, planarizes the convex part 221, thus increasing the binding force between the convex part 221 and a layer laminated on an upper part of the convex part 221. In addition, the cover 222 planarizes the first layer 22 such that the first layer 22 is easily inserted between a laminated structure in which a plurality of layers is laminated. The cover 222 may be made of a material having a refractive index lower than that of the convex part 221 and may have a refractive index of, for example, 1.3 to 1.5. Thus, a difference between the cover 222 and the convex part 221 may be 0.01 to 0.4. In addition, the cover 222 may be made of a photocurable composition, a thermosetting composition, or an adhesive. When the cover 222 is made of an adhesive, the binding force to a layer laminated on an upper part thereof may be further improved.

In conventional displays, a microlens structure was used at the outermost part of the displays. In this case, a refractive index difference between the microlens structure and air is great (refractive index difference of approximately 1), and thus, an image blur phenomenon, wherein output images are not clear, occurs. On the other hand, in an example of the present invention, the first layer 22 including the cover 222 with a low refractive index is disposed between the light emitting layer 10 and the circular polarization layer 30. Accordingly, a refractive index difference between the convex part 221 and air becomes lower than a refractive index difference between the cover 222 and the convex part 221 and thus a refractive index difference between the convex part 221 and an interface is decreased and the first layer 22 is disposed closer to the light emitting layer 10, whereby the focal distance of emitted light is shortened. As a result, image blurring is reduced. In addition, light is concentrated at the convex part 221 and thus the brightness of a front surface increases.

The second layer 21 improves color shift and removes total reflection. A side of the second layer 21 contacts and binds to a side of the first layer 22. For example, an upper side of the second layer 21 contacts and binds to a lower side of the first layer 22. In addition, the other side of the second layer 21 may contact and bind to the light emitting layer 10. The second layer 21 includes a base material 212 and the scattering particles 211 dispersed in the interior of the base material 212.

The base material 212 may be a thin sheet for maintaining the shape of the second layer 21 and may be made of a polymer resin such as a thermosetting composition or a photocurable composition. In addition, the base material 212 may be made of an adhesive. When the adhesive is used, the binding force of the base material 212 to layers laminated on upper and lower parts thereof may be increased. The thermosetting composition may include a thermosetting resin and a hardener. The thermosetting resin may be at least one of an acrylic resin, silicone based resin, or epoxy based resin. The hardener may be an isocyanate compound, an amine based compound, an organic acid anhydride based compound, an amide based compound, a dialdehyde based compound, an aziridine based compound, a metal chelate compound, a metal alkoxide compound, a metal salt, or the like. The photocurable composition may include a photocurable compound and a photoinitiator. The photocurable compound may be a polymer, an oligomer, or a monomer and the photocurable compound may be a combination of two or more of a polymer, an oligomer, and a monomer. Here, examples of the polymer or the oligomer include an acrylic compound, a silicone based compound, an epoxy based compound, etc., which may be used alone or in a combination of two or more thereof.

The scattering particles 211 have a refractive index different from that of the base material 212. That is, the scattering particles 211 may be made of a material having a refractive index greater or lower than that of the base material 212. The scattering particles 211 may have a refractive index of 1.5 to 2.7 and a refractive index difference between the scattering particles 211 and the base material 212 may be 0.01 to 0.7. Here, when the refractive index difference is less than 0.01, it is difficult for incident light to encounter scattering particles and almost no scattering effect is exhibited. When the refractive index difference is greater than 0.7, haze change is great, whereby brightness is decreased and mass-production efficiency is reduced. The scattering particles 211 may be made of any one of $ZrO_2$, $TiO_2$, $Al_2O_3$, $MgO$, and $SiO_2$ and may have a globular shape or various polygonal shapes. The sizes of the scattering particles 211 may be 0.1 to 1 μm. Here, the sizes refer to average diameters of particles. When the sizes of the scattering particles 211 are within this range, the sizes of the scattering particles 211 are similar to those of particles in a wavelength of a visible light area and thus the Mie scattering effect is maximized, whereby forward scattering can occur. Accordingly, linearity of light at a specific wavelength can be reduced, and thus, a color shift phenomenon wherein color is distorted according to viewing angle may be reduced. In addition, a fill ratio of the scattering particles 211, i.e., the content of the scattering particles 211 with respect to a total weight of the second layer 21, may be 0.01 to 3% by weight. When the content is less than 0.01% by weight, improvement in color shift is slight. When the content is greater than 3% by weight, brightness is decreased and improvement in black visibility is slight.

In general, when a film including scattering particles dispersed therein is attached onto an upper part of a display, total reflection is eliminated and color shift can be somewhat improved. However, in this case, light at an angle at which total reflection does not occur is also scattered and thus the brightness of a front surface is decreased. In addition, a screen that should look black when a display is turned off (black visibility) looks bright. On the other hand, in an example of the present invention, an optical member including a layer, which includes scattering particles dispersed therein, and a layer, which includes a convex part, is provided and disposed under a retardation film, whereby the decrease in the brightness of a front surface can be inhibited, color shift can be efficiently improved, and black visibility can be remarkably increased.

Hereinafter, referring to FIG. 2, the structure of the optical member and refractive index relationship between members are described in more detail.

In the optical member, the thickness (e) of the first layer 22 may be greater than or equal to thickness (f) of the second layer 21. For example, the thickness (e) of the first layer 22 may be 0.2 to 130 μm and the thickness (f) of the second layer 21 may be 0.1 to 130 μm. When the thickness (e) of the first layer 22 is 100, the height (c+d) of the convex part 221 may be 60 to 100. In addition, the height (c+d) of the convex part 221 may be 0.2 to 80 μm, the height (c) of the protrusions 221b of the convex part 221 may be 0.1 to 50 μm, and the height (d) of the residual part 221a of the convex part 221 may be 0.1 to 30 μm. In addition, the height (b) from the tops of the protrusions 221b to an upper side of the first layer 22 may be 0 to 50 μm. That is, when the height (b) is 0, the upper side of the first layer 22 is planarized in accordance with the tops of the protrusions 221b.

Here, when the height (b) is less than 0, the cover 222 covers to a height lower than that of the protrusions 221b, and thus, the upper part of the first layer 22 is not formed into a planarized side. Accordingly, the binding force between the second layer 21 and a layer bound thereto is decreased. In addition, when the height (b) is greater than 50 μm, the transmittance of an optical member is decreased and thus brightness is reduced. Meanwhile, the height between the residual layer 221a of the convex part 221 and the upper side of the first layer 22, i.e., the height (a) of the cover 222, is greater than the height (c) of the protrusions 221b of the convex part 221. When the height (a) is less than the height (c) of the protrusions 221b, the cover 222 covers to the height (b) less than the height of the protrusions 221b and thus the upper part of the first layer 22 is not formed into a planarized side, whereby the binding force between the first layer 22 and a layer bounded thereto is decreased. In addition, the height (a) of the cover 222 may be 0.1 to 100 μm. When the height (a) of the cover 222 is too small, the convex part 221 might not be satisfactorily covered. When the height (a) of the cover 222 is too great, the transmittance of light is decreased.

Meanwhile, components of the optical member have suitable refractive index relationships. For example, when the refractive index of the base material 212 is n1, the refractive index of the convex part 221 is n2, the refractive index of the cover 222 is n3, and the refractive index of the scattering particles 211 is n4, n2 may be greater than n1 and n3 and the value of n1 may be different from that of n4. That is, the relation, $n1<n2$, $n3<n2$, $n1 \neq n4$, is possible and a difference between n1 and n4 may be 0.01 to 0.7. Here, when the refractive index of the base material 212, n1, is greater than the refractive index of the convex part 221, n2, optical extraction efficiency is decreased by total reflection at an interface. When the refractive index of the cover 222, n3, is greater than the refractive index of the convex part 221, n2, light concentration efficiency of the convex part 221 is decreased. In addition, when the refractive index of the base material 212, n1, is the same as the refractive index of the scattering particles 211, n4, light scattering effect is minimal.

Hereinafter, a light emission path is described in detail referring to FIG. 3. FIG. 3 conceptually illustrates a light emission path in a display according to an example of the present invention.

A display according an example to the present invention includes an optical member wherein the first and second layers 22 and 21 are disposed between the light emitting layer 10 and the retardation film 31. Accordingly, light generated from the light emitting layer 10 is scattered and refracted, whereby optical extraction efficiency increases and an image blur phenomenon is decreased. As a result, a color shift phenomenon is improved.

Light generated from the light emitting layer 10 collides with the dispersed scattering particles 211, thus being scattered. That is, light is scattered by the scattering particles 211, thus proceeding forward while being dispersed into multiple beams. Subsequently, the light is refracted at an interface due to a refractive index difference between the convex part 221 and the cover 222 and proceeds forward. That is, the light does not proceed in a side direction of the display and proceeds toward an upper part of the polarizing film 32. As such, the light is scattered into multiple beams by the scattering particles 211 and proceeds forward, a conventional image blur phenomenon can be inhibited and color shift can be improved. In addition, the first layer 22 inhibits light generated from the light emitting layer 10 from being totally reflected and emitted, and increases optical extraction efficiency by allowing the light to be emitted to a front surface part.

Hereinafter, various modified forms of the optical member of the present invention are described with reference to FIG. 4. FIG. 4 illustrates optical members according to various modified examples of the present invention.

The optical member may employ various types, other than the type wherein the second layer 21 is directly bound to a lower part of the first layer 22 (FIG. 4(a)). For example, a third layer 23 may be separately disposed between the first layer 22 and the second layer 21 (FIG. 4(b)), and the second layer 21 may be disposed on an upper part of the first layer 22 (FIG. 4 (c)). Here, the third layer 23 may include a polymer resin and, due to the insertion of the third layer 23, binding between the first layer 22 and the second layer 21 may be increased and a manufacturing process of an optical member may be easily carried out. In addition, the path of light is changed when the order of the first layer 22 and the second layer 21 is changed. That is, when the optical member of FIG. 4(a) is disposed in a display, light emitted from the light emitting layer is scattered and refracted, as described above. When the optical member of FIG. 4(c) is disposed in a display, light emitted from the light emitting layer is refracted and scattered. In this case, optical extraction efficiency is increased and an image blur phenomenon is reduced, thereby improving a color shift phenomenon. In addition, the shape of the convex part 221 of the optical member may be varied, as described in detail above. For example, protrusions may be made of triangular prism elements (FIG. 4(d)).

Hereinafter, various modified examples of the display of the present invention are described in detail with reference to FIG. 5. FIG. 5 schematically illustrates displays according to various modified examples of the present invention.

The display may have various modified structures, other than the structure wherein the optical member is disposed on an upper part of the light emitting layer 10. For example, a light transmission window (cover glass) 40 may be disposed on the upper part of the circular polarization layer 30 (FIG. 5(a)), a touch panel 50 may be disposed on the upper part of the circular polarization layer 30 (FIG. 5(b)), and the touch panel 50 may be disposed between the light emitting layer 10 and the pattern layer 20 (FIG. 5(c)). Of course, various modifications, other than these structures, are applicable.

EXAMPLES

Experimental Example and Conventional Examples

Hereinafter, a particular experimental example of the present invention and conventional examples are described.

In the experimental example, an optical member was manufactured by binding a first layer, which includes scattering particles dispersed in a base material, and a second layer, which includes a convex part. First, 49.47% by weight of an optically clear adhesive (OCA) having a refractive index of 1.5, as a base material, was mixed with 0.5% by weight of scattering alumina ($Al_2O_3$) particles having a refractive index of 1.77, 50% by weight of ethyl acetate, and 0.03% by weight of a hardener. A resultant mixture, i.e., a dispersion including scattering particles, was coated to a thickness of about 200 μm, followed by drying in a 100° C. oven. As a result, a second layer having a thickness of about 30 μm was manufactured. Subsequently, an ultraviolet (UV)-curable resin (n=1.58) was coated on one side of the second layer, followed by molding by an imprinting process and curing by means of a UV curing machine. As a result, a convex part including protrusions was manufactured. Here, the height of the convex part was approximately 8 μm and the pitch between the protrusions was approximately 30 μm. In addition, a photocurable resin having a low refractive index of 1.47 was coated on an upper side of the convex part, followed by curing by means of a UV curing machine. As a result, a first layer was manufactured.

In conventional examples, an optical member was not used or a microlens was used as an optical member. That is, in Conventional Example 1, an optical member was not used and, in Conventional Example 2, a layer, in which a microlens as an optical member was formed, was used. In Conventional Example 2, an optical member was manufactured by coating a UV curable resin (n=1.58) having a refractive index of 1.58 on one side of a PET film, followed by molding by an imprinting process and curing by means of a UV curing machine. As a result, a plurality of microlenses was manufactured. Here, the heights of the microlenses were 8 μm and the pitches between the microlenses were 30 μm.

Each optical member manufactured as described above was disposed in a display and optical performance thereof was observed. An organic light-emitting display panel (OLED panel) generally supplied and commercially used was used as a light source and a commercially used circular polarization film was used as a circular polarization layer. Each optical member was disposed on an upper part of the circular polarization film and the brightnesses and color coordinates thereof, which are dependent upon viewing angles, were measured by means of an EZ contrast device (manufactured by Eldim, France). Pixel images thereof were captured by means of a VK-9500 microscope (manufactured by KEYENCE, Japan).

First, in the case in which a separate optical member was not installed (Conventional Example 1), the circular polarization layer was laminated on an upper part, through which light is emitted to the outside, of the light source (OLED panel) in order to observe optical performance. Brightnesses and color coordinates dependent upon viewing angles were measured by means of an EZ contrast device. In addition, to investigate an image blur phenomenon, the circular polarization layer was removed and a pixel image was captured by means of a VK-9500 microscope.

In addition, to evaluate optical performance in Conventional Example 2, the light source and the circular polarization layer were laminated, as described above, and then the optical member of Conventional Example 2 was laminated on an upper part of the circular polarization layer. Brightnesses and color coordinates dependent upon viewing angles were measured by means of an EZ contrast device. In addition, to investigate an image blur phenomenon, the circular polarization layer was removed and then a pixel image was observed by means of a VK-9500 micro scope.

Further, to evaluate optical performance in the experimental example, the light source and the circular polarization layer were laminated, as described above, and the optical member of Conventional Example 2 was disposed therebetween. Brightnesses and color coordinates dependent upon viewing angles were measured by means of an EZ contrast device. In addition, to investigate an image blur phenomenon, the circular polarization layer was removed and then a pixel image was observed by means of a VK-9500 microscope.

Table 1 shows the measured brightness and color coordinate values, FIG. 6 illustrates color coordinate graphs dependent upon viewing angles in the experimental example of the present invention and the conventional examples, and FIG. 7 illustrates pixel images in the experimental example of the present invention and the conventional examples.

Table 1 shows the measured brightnesses and color coordinates. The brightnesses refer to an average value of brightness values respectively measured at nine loci among the areas of the upper part of the optical member disposed on each of the displays. The color coordinates (u', v') were converted to CIE 1976 UCS (u', v') values according to the following equation, based on measured CIE 1931 (x,y) values, and then 0 degrees was normalized to a value of 1, to perform comparison.

$$u=4x/-2x+12y+3$$

$$v=6y/-2x+12y+3$$

$$u'=u$$

$$v'=3v/2 \quad \text{Equation)}$$

TABLE 1

|  | Brightness (cd/m$^2$) | Color coordinate (u', v') | | | | |
| --- | --- | --- | --- | --- | --- | --- |
|  |  | −70 degree | −30 degree | 0 degree | 30 degree | 70 degree |
| Conventional Example 1 | 344.7 | 0.8842 | 0.9851 | 1.0000 | 0.9818 | 0.8731 |
| Conventional Example 2 | 352.5 | 0.8929 | 0.9869 | 1.0000 | 0.9850 | 0.8780 |
| Experimental Example 1 | 361.2 | 0.9194 | 0.9912 | 1.0000 | 0.9953 | 0.9378 |

As shown in Table 1 and FIG. 6, it can be confirmed that the brightness in the experimental example is improved, compared to Conventional Examples 1 and 2. In addition, it can be confirmed that a color shift phenomenon in the experimental example is improved, compared to Conventional Examples 1 and 2. That is, it can be confirmed that, in Conventional Example 1, in which the display not including an optical member is used, and Conventional Example 2, in which the microlens is used as an optical member, a color shift phenomenon is worsened with increasing viewing angles. In particular, it can be confirmed that rapid color shift occurs at 60 degrees or more. On the other hand, it can be confirmed that, in the experimental example, i.e., in the case in which the optical member according to the example of the present invention is applied to a lower part of the retardation film of the display, viewing angles change, but smooth color change is exhibited. From this data, it can be confirmed that the color shift phenomenon is improved.

In addition, referring to FIG. 7, a pixel image in Conventional Example 1 in which the organic light-emitting display panel does not include a separate optical member is illustrated in FIG. 7(a). However, in Conventional Example 2, i.e., in the case in which the layer in which microlenses are formed is applied to an outermost part of the display panel, each of pixels is overlapped, whereby a clear image cannot be obtained and a screen distortion phenomenon is observed (FIG. 7(b)). On the other hand, in the experimental example, i.e., in the case in which the optical member of the example of the present invention is applied to a lower part of the retardation film of the display panel, the pixel overlapping phenomenon is improved, thus obtaining a clear image (FIG. 7(c)).

Examples of the organic light-emitting display have been described above, but the present invention is not limited thereto. The present invention can be applied to various devices to increase optical extraction efficiency and improve image blur and color shift phenomena.

The technical idea of the present invention has been particularly described through the aforementioned examples. However, it should be noted that the examples were provided for explanation and the present invention is not limited thereto. In addition, those skilled in the art will understand that various modifications are possible within the range of the technical idea of the present invention.

What is claimed is:

1. An optical member, comprising:
a first layer comprising a convex part, which comprises a plurality of protrusions, and a cover, which has a refractive index lower than that of the convex part; and
a second layer located on at least one side of the first layer and comprising a plurality of scattering particles dispersed in an interior thereof;
wherein the cover is disposed on an upper part of the convex part to planarize the first layer, and a refractive index difference between the cover and the convex part is smaller than a refractive index difference between the convex part and air;
wherein a refractive index of the cover ranges from 1.3 to 1.5,
wherein a refractive index difference between the convex part and the cover ranges from 0.01 to 0.4,
wherein the second layer comprises a base material and the plurality of scattering particles are dispersed within the base material,
wherein a refractive index of the scattering particles ranges from 1.5 to 2.7,
wherein a refractive index difference between the base material and the scattering particles ranges from 0.01 to 0.7,
wherein a diameter of the scattering particles ranges from 0.1 μm to 1 μm,
wherein a thickness of the first layer ranges from 0.2 μm to 130 μm, a thickness of the second layer ranges from 0.1 μm to 130 μm, and the thickness of the first layer is greater than or equal to the thickness of the second layer, and wherein, when a thickness of the first layer is 100 μm, a height of the convex part ranges from 60 to 100 μm.

2. The optical member according to claim 1, wherein at least one of the cover and the base material comprises an adhesive.

3. The optical member according to claim 1, wherein a third layer comprising a polymer resin is disposed between the first and second layers.

4. The optical member according to claim 1, wherein the protrusions have at least one of a unidirectionally extended rod shape and separated island shape and the protrusions contact each other or are spaced apart from each other.

5. The optical member according to claim 1, wherein a height from tops of the protrusions to an upper side of the first layer ranges from 0 μm to 50 μm.

6. The optical member according to claim 1, wherein, when a refractive index of the base material is n1, a refractive index of the convex part is n2, a refractive index of the cover is n3, and a refractive index of the scattering particles is n4, n2 is greater than n1 and n3 and a value of n1 differs from a value of n4.

7. A display comprising the optical member according to claim 1, the display further comprising:
a light emitting layer in which light is generated;
a circular polarization layer formed on the light emitting layer; and
a pattern layer which is disposed between the light emitting layer and the circular polarization layer and comprises the first layer and the second layer.

8. The display according to claim 7, wherein the circular polarization layer comprises a retardation film (QWP) and a polarizing film formed on the retardation film (QWP).

9. The display according to claim 8, wherein the first layer contacts the retardation film and the second layer contacts the light emitting layer.

10. The display according to claim 9, wherein a third layer comprising a polymer resin is disposed between the first and second layers.

11. The display according to claim 7, wherein a touch panel is disposed on an upper part of the circular polarization layer or between the light emitting layer and the optical member.

12. The display according to claim 7, wherein, when a refractive index of the base material is n1, a refractive index of the convex part is n2, a refractive index of the cover is n3, and a refractive index of the scattering particles is n4, n2 is greater than n1 and n3 and a value of n1 differs from a value of n4.

13. The display according to claim 7, wherein a height of the cover is 0.1 to 100 μm and heights of the protrusions are 0.1 to 50 μm.

14. The display according to claim 7, wherein the scattering particles are comprised in an amount ranging from 0.01 to 3% by weight based on a total weight of the second layer.

* * * * *